(12) United States Patent
Lim

(10) Patent No.: US 7,712,433 B2
(45) Date of Patent: May 11, 2010

(54) SPRAY NOZZLE FOR USE IN MANUFACTURE OF IMAGE DISPLAY DEVICE AND SPRAYING APPARATUS USING THE SAME

(75) Inventor: Su Hyun Lim, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 924 days.

(21) Appl. No.: 11/476,742

(22) Filed: Jun. 29, 2006

(65) Prior Publication Data

US 2007/0151513 A1    Jul. 5, 2007

(30) Foreign Application Priority Data

Dec. 29, 2005    (KR) .................... 10-2005-0133111

(51) Int. Cl.
| | |
|---|---|
| B05B 7/06 | (2006.01) |
| B05B 3/00 | (2006.01) |
| B05B 17/00 | (2006.01) |
| B05B 1/14 | (2006.01) |
| B05B 1/30 | (2006.01) |

(52) U.S. Cl. .............. 118/313; 118/315; 118/323; 239/587.1; 239/550; 239/599; 239/601

(58) Field of Classification Search ............... 118/321, 118/323, 313–316; 347/38, 47, 40; 239/240, 239/726, 752, 587.1, 587.2, 587.3, 587.4, 239/587.5, 587.6, 548, 550, 556, 557, 566, 239/597–601

See application file for complete search history.

(56) References Cited

U.S. PATENT DOCUMENTS

| 4,920,997 A | * | 5/1990 | Vetter et al. ............... 134/57 R |
| 2007/0018129 A1 | * | 1/2007 | Guala ......................... 251/149 |

FOREIGN PATENT DOCUMENTS

| EP | 1312388 A1 | * | 5/2003 |
| KR | 2005000178 A | | 3/2005 |

* cited by examiner

Primary Examiner—Yewebdar T Tadesse
(74) Attorney, Agent, or Firm—Holland & Knight LLP

(57) ABSTRACT

A spray nozzle for use in the manufacture of an image display device includes a first body having a first injection hole, and a second body configured to be rotatably coupled to the first body and having a second injection hole to inject fluid that is supplied thereinto from the first injection hole.

7 Claims, 7 Drawing Sheets

SPRAY NOZZLE FOR USE IN MANUFACTURE OF IMAGE DISPLAY DEVICE AND SPRAYING APPARATUS USING THE SAME

This application claims the benefit of the Korean Patent Application No. P2005-0133111, filed on Dec. 29, 2005, which is hereby incorporated by reference in its entirety.

BACKGROUND OF THE INVENTION

1. Field of the Invention

The present invention relates to an apparatus for manufacturing an image display device, and more particularly, to a spray nozzle for use in the manufacture of an image display device and spraying apparatus using the same. Although the present invention is suitable for a wide scope of applications, it is particularly suitable for regulating an injection angle of fluid to be discharged from a spray nozzle during a spraying process, and a spraying apparatus using a spray nozzle.

2. Discussion of the Related Art

Recently, a variety of light and thin, flat panel display devices, which solve the weight and bulk problems of cathode ray tubes have attracted considerable attention. Accordingly, flat panel displays have been replacing cathode ray tubes. Examples of flat panel display devices include liquid crystal displays, field emission displays, plasma display panels, and light emitting displays.

Among the variety of flat panel display devices, liquid crystal displays are designed to display an image via a regulation of light transmissibility through liquid crystal molecules using an electric field. More specifically, a liquid crystal display includes a liquid crystal panel in which liquid crystal cells are arranged in a matrix form, and a drive circuit to drive the liquid crystal panel. The liquid crystal panel is provided with a common electrode and pixel electrodes to apply an electric field to each of the liquid crystal cells. Typically, the pixel electrodes are formed on a lower substrate at positions corresponding to the respective liquid crystal cells. The common electrode is integrally formed across the entire surface of an upper substrate. The pixel electrodes are connected to thin film transistors (hereinafter, referred to as "TFTs"), which are used as switching devices. The pixel electrodes are used to drive the liquid crystal cells, along with the common electrode, in accordance with data signals fed through the TFTs.

FIG. 1 is a cross-sectional view schematically illustrating a related art liquid crystal panel. As shown in FIG. 1, the related art liquid crystal panel includes a color filter array substrate 4 and a TFT array substrate 2 with liquid crystal molecules 52 filled in a gap between the color filter array substrate 4 and the TFT array substrate 2. The color filter array substrate has a black matrix 44, a color filter 46, an overcoat layer 47, a common electrode 48, and an upper alignment film 50a formed in sequence. The TFT array substrate 2 has a TFT, a pixel electrode 22, and a lower alignment film 50b formed in sequence.

The TFT of the TFT array substrate 2 includes: a gate electrode 6 connected to a gate line; a source electrode 8 connected to a data line; and a drain electrode 10 connected to the pixel electrode 22 through a drain contact hole 26. The TFT further includes a semiconductor layer 14 to generate a conductive channel between the source electrode 8 and the drain electrode 10 when a gate voltage is applied to the gate electrode 6. The semiconductor layers 16 provide a low resistance contact between the semiconductor layer 14 and each of the source and the drain electrodes 8 and 10. The TFT selectively feeds a data signal from the data line (not shown) to the pixel electrode 22 in response to a gate signal from the gate line (not shown).

The pixel electrode 22 is located in a pixel region that is defined by the data line and the gate line, and is made of a transparent conductive material having a high light transmissibility. The pixel electrode 22 is formed on a protective film 18 that is over the entire surface of the lower substrate 1. The pixel electrode 22 is electrically connected to the drain electrode 10 through the drain contact hole 26 in the protective film 18. A potential difference is generated between the pixel electrode 22 and the common electrode 48, which is formed on the upper substrate 42, when a data signal is fed to the pixel electrode 22 by way of the TFT. Due to the dielectric anisotropy of the liquid crystal molecules 52, the potential difference causes a rotation of the liquid crystal molecules 52 located between the lower substrate 1 and the upper substrate 42. Because the liquid crystal molecules 52 can be rotated, the quantity of light transmitted from a light source to the upper substrate 42 by way of the pixel electrode 22 can be regulated.

The black matrix 44 of the color filter array substrate 4 is formed to overlap the TFT, the gate lines (not shown), the data lines (not shown) of the lower substrate 1, and to define a pixel region where the color filter 46 will be formed. The black matrix 44 serves to prevent light leakage while absorbing external light, thereby achieving an increase in the contrast ratio. The color filter 46 is formed in the pixel region defined by the black matrix 44. The color filter 46 includes red, green, and blue color filters, to enable emission of light of red, green, and blue colors. The overcoat layer 47 is formed by applying transparent resin, having an insulation property, on the upper substrate 42 after the color filter 46 is formed on the upper substrate 42. The overcoat layer 47 serves to electrically insulate the black matrix 44 from the common electrode 48 to which a common voltage is applied. In the alternative, the overcoat layer 47 may be omitted in TN-mode devices.

A potential difference is generated between the pixel electrode 22 and the common electrode 48, which has a common voltage applied thereto, when a data signal is fed to the pixel electrode 22 by way of the TFT. The common voltage can be a reference voltage for reorientation of the liquid crystal molecules 52. In the case of IPS mode devices, the common electrode is formed on the lower substrate 1 rather than the upper substrate 42.

The upper and lower alignment films 50a and 50b for use in the initially alignment of liquid crystal molecules 52 are formed on the color filter array substrate 4 and the TFT array substrate 2, respectively, by applying an alignment material, such as polyimide (PI), onto the pixel electrode 22 and the common electrode 48, and then, performing a rubbing process.

A method for manufacturing the liquid crystal panel includes a photoresist (hereinafter, referred to as "PR") patterning process, an etching process, and a PR pattern stripping process, which are used in either patterning electrodes or forming contact holes. Also, a washing process can be performed prior to or after performing one or more of the above described processes. The PR patterning process, etching process, and PR pattern stripping process are used for the formation of color filters and the patterning of electrodes as well as in the manufacture of TFTs. The etching process, PR pattern stripping process, and washing process are spraying processes, and therefore, these spraying processes are performed by use of a spraying apparatus that is designed to inject a chemical material or de-ionized (DI) water onto a substrate using spray nozzles.

FIG. 2 is a schematic view illustrating a related art spraying apparatus. As shown in FIG. 2, the related art spraying apparatus includes a substrate 60, a pipe 70 positioned over the substrate 60, a tube 72 for supplying fluid into the pipe 70, and a plurality of spray nozzles 80 mounted on the pipe 70 for spraying fluid supplied into the pipe 70 onto the substrate 60. The fluid, which is supplied into the pipe 70, is either a chemical material for etching or stripping a pattern on the substrate 60, or de-ionized water for washing the substrate 60. The pipe 70 is mounted parallel to either a longer or shorter side of the substrate 60 at a predetermined height above the substrate 60. The fluid is supplied at a predetermined pressure from an external tank (not shown) into the pipe 70 by way of the tube 72.

FIG. 3 is a view illustrating a spray nozzle of FIG. 2. As shown in FIG. 3, each of the plurality of spray nozzles 80 is formed with an injection hole 81 having a circular cross-section. The injection hole 81 is used to inject the fluid, which is supplied from the pipe 70, onto the substrate 60 at a predetermined injection angle and with a predetermined injection pressure.

The related art spraying apparatus having the above described configuration is able to inject the fluid onto the substrate 60 through the injection holes 81 formed in the plurality of spray nozzles 80, thereby etching or stripping a pattern formed on the substrate 60, or washing the substrate 60. To achieve a uniform pattern etching or stripping effect during the etching or pattern stripping process, the injection angle of the spray patterns for the plurality of spray nozzles 80 can not be concentrated and the spray patterns should overlap without each other. Similarly, to uniformly wash a substrate, the injection angle of the spray patterns for the plurality of spray nozzles 80 can not be concentrated and the spray patterns should overlap with each other. Further, to prevent damage to the substrate, the injection pressure of the injected fluid impacting the substrate can not be too strong. Thus, the injection angle and the injection pressure of the fluid must be regulated.

In the case of the related art spraying apparatus, both the injection angle and the injection pressure of the injected fluid are determined in accordance with the shape and size of the injection holes 81 that are formed in the plurality of spray nozzles 80, and to some extent, by the height of the nozzles above the substrate and the pressure within the pipe. Thus, the injection angle and the injection pressure can not be easily regulated for different fluids or for spraying processes injecting fluids at different injection pressures. Typically, a different pipe with different nozzles are used for different fluids. Further, minor variations amongst the plurality of nozzles causes the entire pipe having a plurality of spray nozzles to be adjusted for the worst performing spray nozzle on the pipe.

SUMMARY OF THE INVENTION

Accordingly, the present invention is directed to a spray nozzle for use in the manufacture of an image display device and a spraying apparatus using the same that substantially obviate one or more problems due to limitations and disadvantages of the related art.

An object of the present invention is to provide a spray nozzle for use in the manufacture of an image display device, which can regulate an injection angle of fluid to be injected from the nozzle during a spraying process, and a spraying apparatus using the spray nozzle.

An object of the present invention is to provide a spray nozzle for use in the manufacture of an image display device, which can regulate an injection pressure of fluid to be injected from the nozzle during a spraying process, and a spraying apparatus using the spray nozzle.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a spray nozzle for use in the manufacture of an image display device includes a first body having a first injection hole, and a second body configured to be rotatably coupled to the first body and having a second injection hole to inject fluid that is supplied thereinto from the first injection hole.

In another aspect of the present invention, a spraying apparatus for use in the manufacture of an image display device includes a substrate, a pipe positioned over the substrate into which fluid is supplied from an external source, and a plurality of spray nozzles mounted to the pipe, each of the plurality of spray nozzles having at least two injection holes with rotatably intersecting cross-sectional shapes having an intersecting area through which fluid can be injected onto the substrate.

In yet another aspect, a spraying apparatus for use in the manufacture of an image display device includes a pipe into which fluid can be supplied from an external source, and first bodies rotatably coupled to the pipe and having first injection holes with a first cross-sectional shape, and second bodies rotatably coupled to the first bodies and having second injection holes with a second cross-sectional shape.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Figure 1:
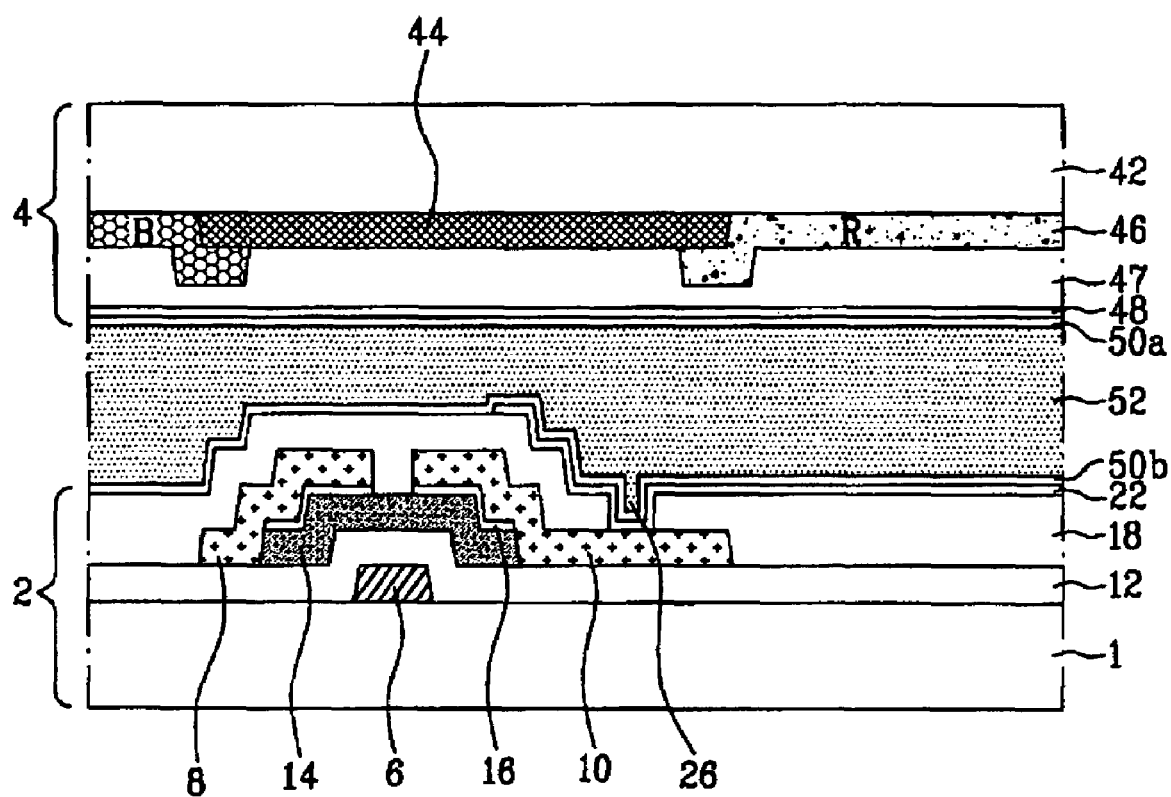
FIG. 1 is a cross-sectional view schematically illustrating a related art liquid crystal panel.
Figure 2:
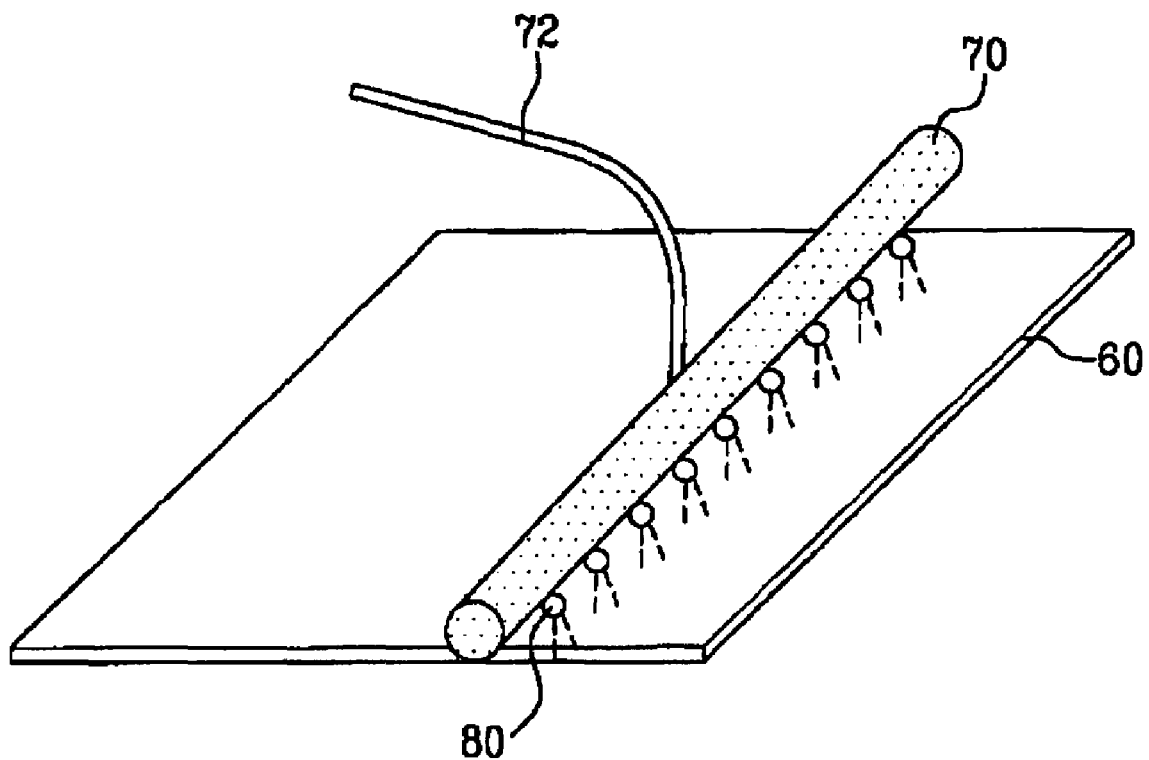
FIG. 2 is a schematic view of a related art spraying apparatus.
Figure 3:
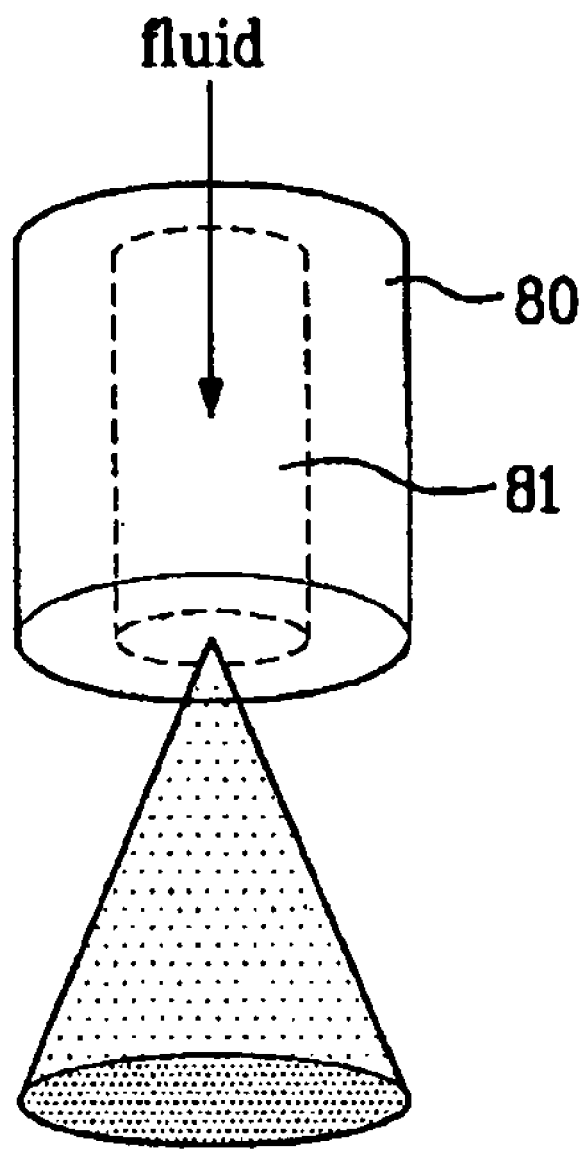
FIG. 3 is a view illustrating a spray nozzle of FIG. 2.
Figure 4:
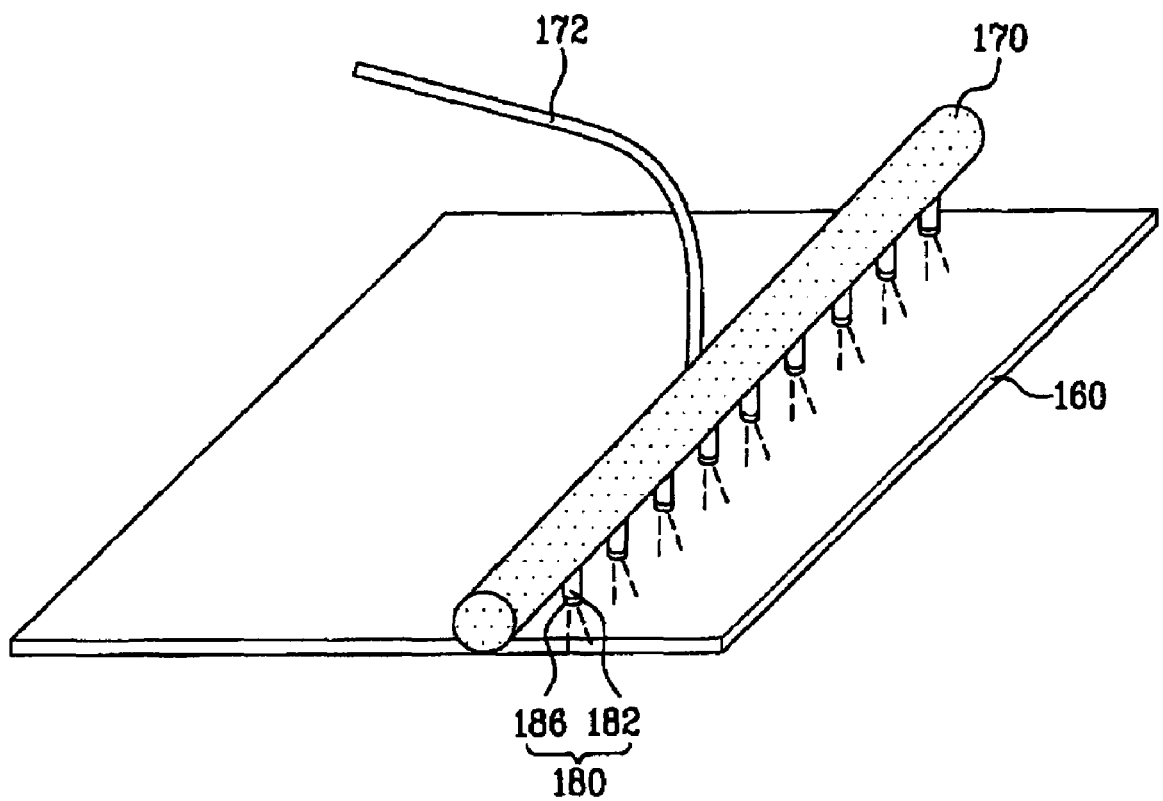
FIG. 4 is a schematic view illustrating a spray nozzle for use in the manufacture of an image display device and a spraying apparatus using the same, in accordance with an embodiment of the present invention.

FIG. 4 is a schematic view illustrating a spray nozzle for use in the manufacture of an image display device and a spraying apparatus using the same, in accordance with an embodiment of the present invention. As shown in FIG. 4, the spraying apparatus for use in the manufacture of an image display device in accordance with an embodiment of the present invention includes a substrate 160, a pipe 170 positioned over the substrate 160, a tube 172 for supplying fluid into the pipe 170, and a plurality of spray nozzles 180 mounted onto the pipe 170. Each of the plurality of spray nozzles 180 having at least two injection holes with rotatably intersecting cross-sectional shapes having an intersecting area through which fluid can be injected onto the substrate 160.

The fluid supplied into the pipe 170 can either be a chemical for etching or stripping a pattern formed on the substrate 160, or de-ionized water for washing the substrate 160. The pipe 170 is mounted parallel to either a longer or shorter side of the rectangular substrate 160 at a predetermined height from the substrate 160. The fluid is supplied at a predetermined pressure from an external tank (not shown) into the pipe 170 by way of the tube 172.

Figure 5:
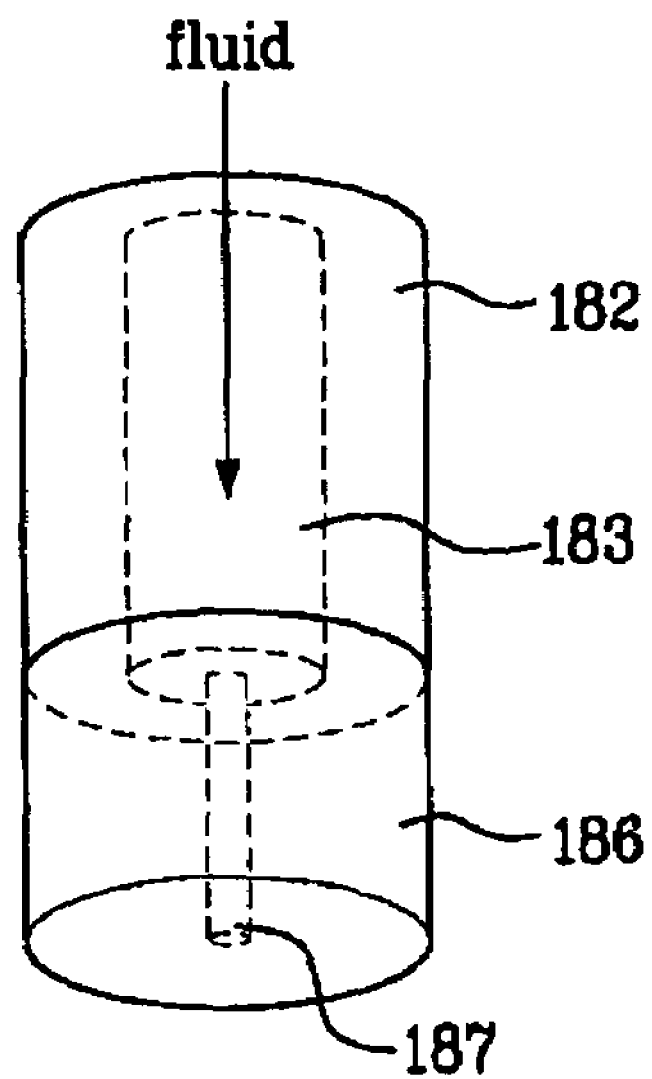
FIG. 5 is a view illustrating a spray nozzle of FIG. 4.
Figure 6:
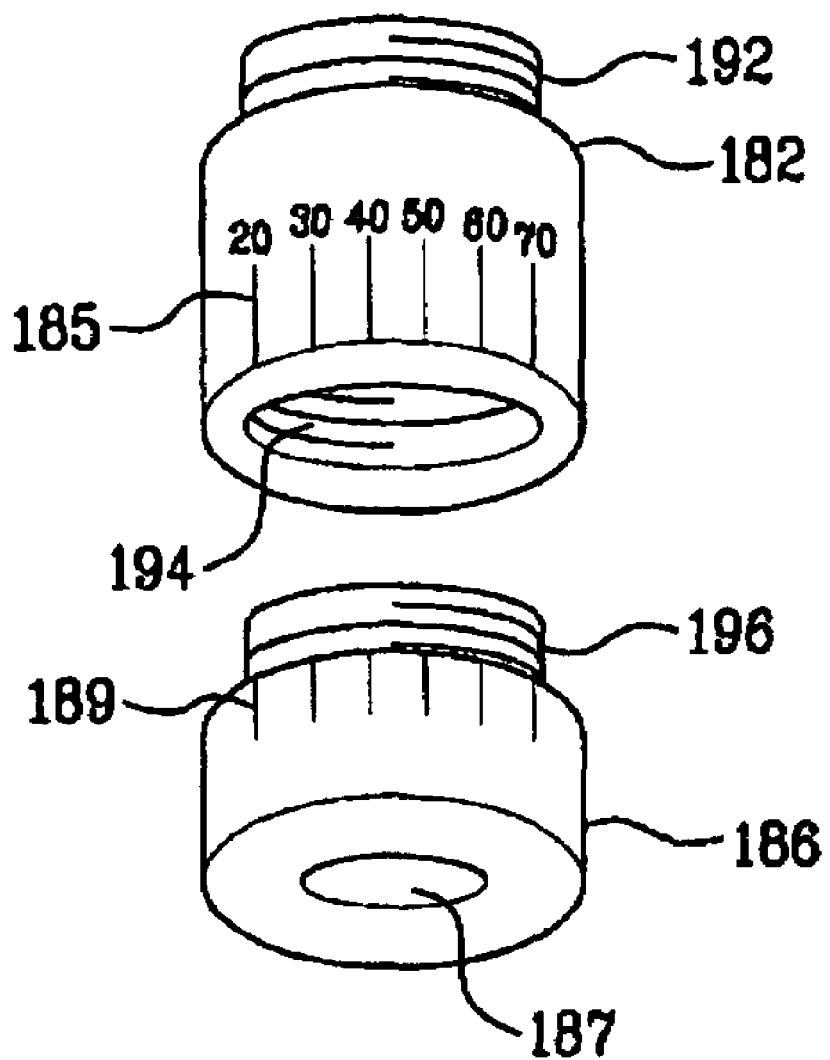
FIG. 6 is an exploded perspective view illustrating the spray nozzle of FIG. 5.

FIG. 5 is a view illustrating a spray nozzle of FIG. 4. FIG. 6 is an exploded perspective view illustrating the spray nozzle of FIG. 5. As shown in FIGS. 5 and 6, each of the plurality of spray nozzles 180 includes a first body 182 having a first injection hole 183 perforated therethrough, and a second body 186 having a second injection hole 187 perforated therethrough.

The first body 182 has an upper coupling portion 192 for coupling to the pipe 170, a lower coupling portion 194 for coupling to the second body 186, a first injection hole 183 in the first body 182, and a first graduated scale 185 formed at an outer circumference of the first body 182 with predetermined intervals. The first body 182 is attached via the upper coupling portion 192 to the pipe 170 such that the first body 182 is rotatable in a range of 360 degrees. The first injection hole 183 can have a cross-sectional shape of one of a circle, an oval, and a polygon. The upper coupling portion 192 of the first body 182 is formed with male screw threads to be coupled to the pipe 170. Also, the lower coupling portion 194 of the first body 182 is formed with female screw threads to be coupled to the second body 186. The first body 182 serves to supply the fluid, which is supplied from the pipe 170, through the first injection hole 183 and into the second injection hole 187 of the second body 186.

The second body 186 includes an upper coupling portion 196 rotatably coupled to the lower coupling portion 194 of the first body 182, a second injection hole 187, and a second graduated scale 189 formed at an outer circumference of the second body 186 with a predetermined intervals for regulating an injection angle of fluid passing through the second body 186. The upper coupling portion 196 of the second body 186 is formed with male screw threads to be coupled to the lower coupling portion 194 of the first body 182. A second injection hole 187 can have a cross-sectional shape of one of a circle, an oval, and a polygon. The first injection hole 183 can have a cross-sectional shape that is the same as or different from the second injection hole 187. The second graduated scale 189 of the second body 186 is used to regulate the injection angle and injection pressure of the fluid, which is injected from the second injection hole 187. The second graduated scale 189 is aligned with the first graduated scale 185 of the first body 182 by rotation of the second body 186 to a desired injection angle.

Figure 7A:
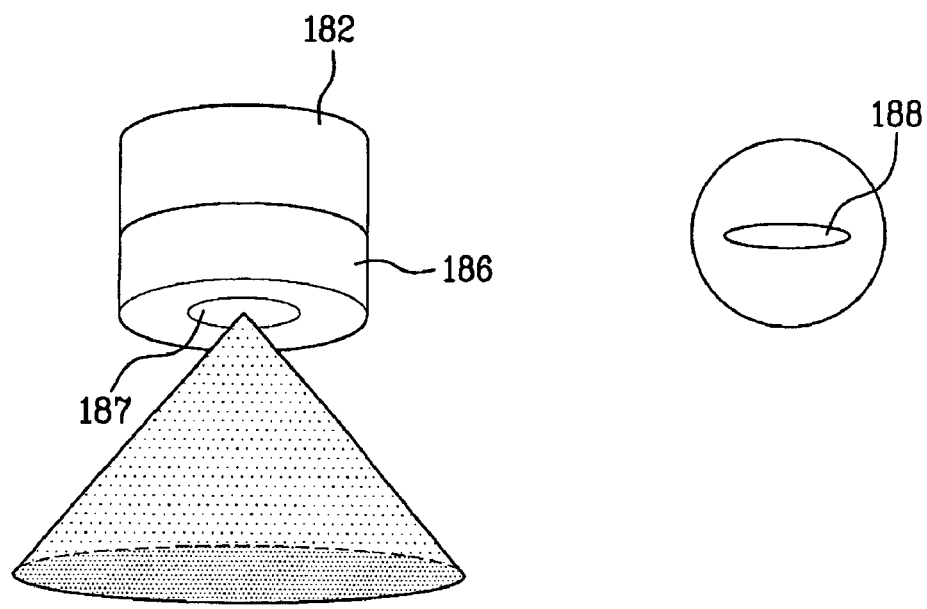
FIGS. 7A and 7B are views explaining a regulation in an injection angle and pressure of fluid obtained by the spray nozzle of FIG. 6.
Figure 7B:
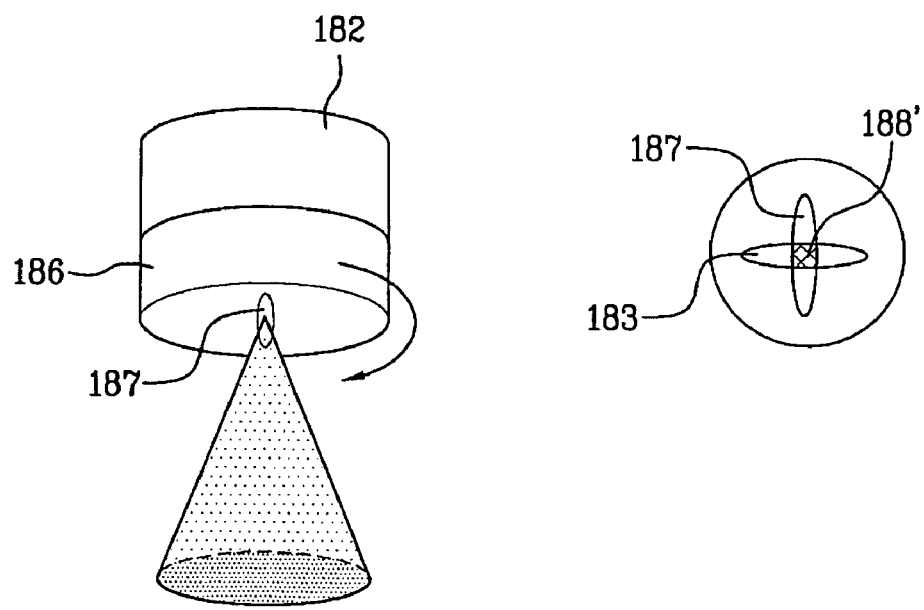

FIGS. 7A and 7B are views explaining regulation in the injection angle and pressure of fluid obtained by the spray nozzle of FIG. 6. First, the first body 182 coupled to the pipe 170 is rotated, to set a fluid injection direction of the first injection hole 183. When it is desired to inject fluid at the maximum injection angle and at the lowest injection pressure, as shown in FIG. 7A, the second body 186 is rotated such that the second injection hole 187 coincides with the first injection hole 183 on the basis of both the first and second graduated scales 185 and 189. When the first injection hole 183 completely coincides with the second injection hole 187, the intersecting area 188 of both the first and second injection holes 183 and 187 is at maximum. Accordingly, each spray nozzle 180 is able to inject the fluid through the maximum intersecting area 188 at a maximum injection angle and the lowest injection pressure.

On the other hand, when it is desired to inject fluid at a minimum injection angle and at the highest injection pressure, as shown in FIG. 7B, the second body 186 is rotated such that the second injection hole 187 perpendicularly intersects with the first injection hole 183 on the basis of both the first and second graduated scales 185 and 189. When the first injection hole 183 and the second injection hole 187 perpendicularly intersect each other, the intersecting area 188' of both the first and second injection holes 183 and 187 is at a minimum. Accordingly, each spray nozzle 180 is able to inject the fluid through the minimum intersecting area 188' at the minimum injection angle and at the highest injection pressure.

When the intersecting area 188 of the first and second injection holes 183 and 187 is regulated to have a certain area by rotating the second body 186 on the basis of the first and second graduated scales 185 and 189, the injection angle and the pressure of fluid can be freely regulated between the maximum injection angle and the minimum injection angle and between the highest injection pressure and the lowest injection pressure, respectively. Accordingly, it will be appreciated from the above description that each spray nozzle for use in the manufacture of an image display device and the spraying apparatus using the spray nozzle in accordance with the embodiment of the present invention can have the injection angle and the injection pressure regulated the intersecting area 188 of the first and second injection holes 183 and 187. Thus, the spraying apparatus using the spray nozzle for use in the manufacture of an image display device in accordance with the embodiments of the present invention is designed to inject the fluid onto the substrate 160 by use of the plurality of spray nozzles 180 such that the injection angle and the injection pressure is regulated to efficiently etch or strip a pattern formed on the substrate 160, or to efficiently wash the substrate 160. The spray nozzles for use in the manufacture of an image display device and the spraying apparatus using the spray nozzles in accordance with the embodiment of the present invention can be used in spraying processes for manufacturing a flat panel display, such as for example, a liquid crystal display, a plasma display panel, or a light emitting display. As is apparent from the above description, the spray nozzle for use in the manufacture of an image display device and the spraying apparatus using the spray nozzle in accordance with the embodiment of the present invention can achieve an accurate regulation in the injection angle and pressure of the fluid, which is injected from the spray nozzle, based on an intersection of at least two injection holes formed in the spray nozzle to improve uniformity in a spraying process.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A spraying apparatus for use in the manufacture of an image display device, comprising:
    a substrate;
    a pipe positioned over the substrate into which fluid is supplied from an external source; and
    a plurality of spray nozzles mounted to the pipe, each of the plurality of spray nozzles having at least two injection holes with rotatably intersecting cross-sectional shapes having an intersecting area through which fluid can be injected onto the substrate,
    wherein each of the plurality of spray nozzles includes a first body rotatably coupled to the pipe and having a first injection hole; and
    a second body rotatably coupled to the first body and having a second injection hole to inject the fluid, which is supplied thereinto through the first injection hole, onto the substrate.

2. The spraying apparatus as set forth in claim 1, wherein each of the first and second injection holes has a cross-sectional shape of one of a circle, an oval, and a polygonal.

3. The spraying apparatus as set forth in claim 1, wherein the fluid is injected from the second injection hole with an injection angle and an injection pressure that are determined by an intersecting area of both the first and second injection holes.

4. The spraying apparatus as set forth in claim 1, wherein each of the plurality of spray nozzles further includes:
    a first graduated scale formed at an outer circumference of the first body; and
    a second graduated scale formed at an outer circumference of the second body and adapted to be aligned with the first graduated scale for regulating the injection angle and injection pressure of the fluid that is injected from the second injection hole.

5. The spraying apparatus as set forth in claim 4, wherein each of the plurality of spray nozzles further includes:
    a first upper coupling portion formed at an upper end of the first body to be rotatably coupled to the pipe;
    a lower coupling portion formed at a lower end of the first body; and
    a second upper coupling portion formed at an upper end of the second body to be rotatably coupled to the lower coupling portion of the first body.

6. The spraying apparatus as set forth in claim 1, wherein the fluid is one of a chemical solution and de-ionized water.

7. The spray nozzle as set forth in claim 1, wherein the first and second injection holes have different cross-sectional shapes.

* * * * *